US008623229B2

(12) United States Patent
Chen et al.

(10) Patent No.: US 8,623,229 B2
(45) Date of Patent: Jan. 7, 2014

(54) MANUFACTURING TECHNIQUES TO LIMIT DAMAGE ON WORKPIECE WITH VARYING TOPOGRAPHIES

(75) Inventors: Chun-Chang Chen, Tainan (TW); Shih-Chi Fu, Zhudong Township (TW); Wang-Pen Mo, Pingtung (TW); Hung Chang Hsieh, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/306,299

(22) Filed: Nov. 29, 2011

(65) Prior Publication Data

US 2013/0137266 A1 May 30, 2013

(51) Int. Cl.
*B44C 1/22* (2006.01)

(52) U.S. Cl.
USPC ............... 216/47; 216/49; 438/689; 438/717; 438/736

(58) Field of Classification Search
None
See application file for complete search history.

(56) References Cited

U.S. PATENT DOCUMENTS

2005/0054194 A1* 3/2005 Tsai et al. ............... 438/638

OTHER PUBLICATIONS

J. Webster (ed.), Wiley Encyclopedia of Electrical and Electronics Engineering, year 1999, pp. 300-320.*
U.S. Appl. No. 13/350,010, filed Jan. 13, 2012, 19 Pages.
Non-Final Office Action dated Sep. 12, 2013 for U.S. Appl. No. 13/350,010, 13 Pages.
S. Wolf and R.N. Tauber, "Silicon Processing for the VLSI Era", vol. 1, Lattice Press, 2000, p. 524.

* cited by examiner

*Primary Examiner* — Lan Vinh
*Assistant Examiner* — Jiong-Ping Lu
(74) *Attorney, Agent, or Firm* — Eschweiler & Associates, LLC

(57) ABSTRACT

Some embodiments relate to a method for processing a workpiece. In the method, a first photoresist layer is provided over the workpiece, wherein the first photoresist layer has a first photoresist tone. The first photoresist layer is patterned to provide a first opening exposing a first portion of the workpiece. A second photoresist layer is then provided over the patterned first photoresist layer, wherein the second photoresist layer has a second photoresist tone opposite the first photoresist tone. The second photoresist layer is then patterned to provide a second opening that at least partially overlaps the first opening to define a coincidentally exposed workpiece region. A treatment is then performed on the coincidentally exposed workpiece region. Other embodiments are also disclosed.

11 Claims, 8 Drawing Sheets

MANUFACTURING TECHNIQUES TO LIMIT DAMAGE ON WORKPIECE WITH VARYING TOPOGRAPHIES

BACKGROUND

Modern integrated circuits (ICs), which may also be referred to as "chips", are made up of alternating conducting layers and insulating layers which are formed over a semiconductor substrate. The alternating conducting and insulating layers collectively establish electrical connection to active regions of devices in the semiconductor substrate (e.g., source/drain regions of a MOSFET or emitter/base/collector regions of a BJT in the substrate). Exterior pins or pads, which are often electrically connected to an upper conducting layer, allow the semiconductor devices to send and receive signals to and from exterior electrical components, such as other circuits or audio/visual input/outputs, for example.

In many cases, modern ICs include a number of different types of devices which can have different topographies. For example, a single IC can include low-voltage logic devices having one topography (e.g., a polysilicon layer exhibiting short sidewalls having a low aspect ratio) as well as FinFETS and/or flash memory devices that have other topographies (e.g., a polysilicon layer exhibiting tall, steep sidewalls having a high aspect ratio). Although the use of these different topographies allows integration of several different types of devices onto a single integrated circuit, the variation in aspect ratio and/or height (relative to a top surface of the substrate) for these different types of devices can lead to challenges in the manufacturing process.

To help streamline the manufacturing process of such devices on a single integrated circuit, the inventors have developed improved manufacturing processes.

DETAILED DESCRIPTION

Figure 1:
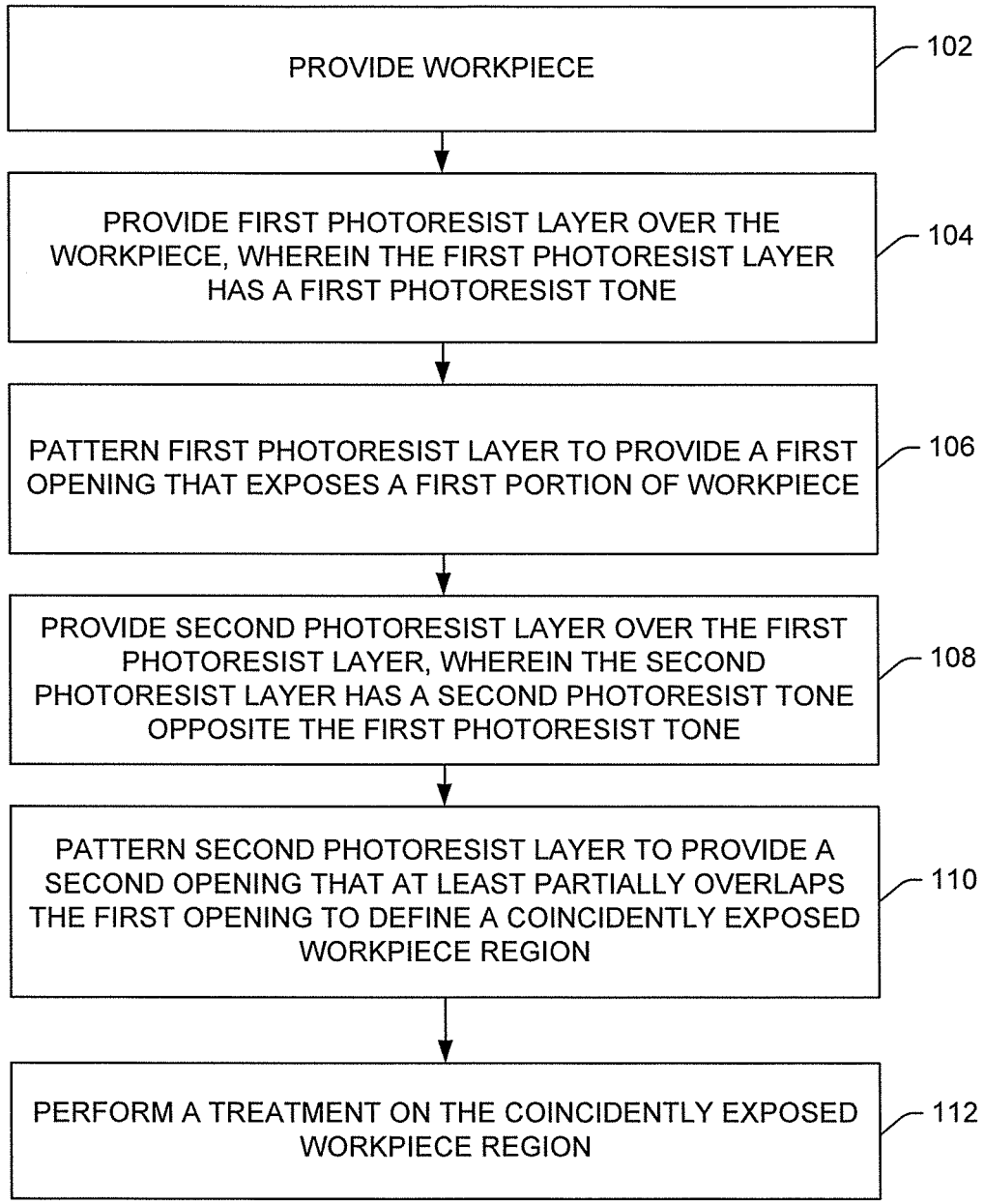
FIG. 1 is a flow diagram illustrating a method of fabricating a semiconductor device in accordance with some embodiments.

One or more implementations of the present invention will now be described with reference to the attached drawings, wherein like reference numerals are used to refer to like elements throughout. The drawings are not necessarily drawn to scale.

Figure 12A:
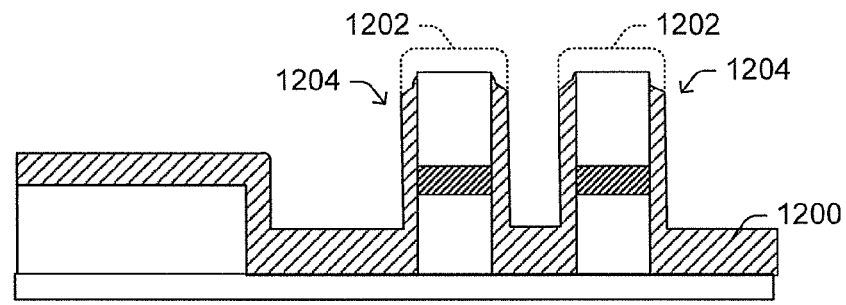
FIGS. 12A-12C are cross-sectional views that collectively illustrate a semiconductor process flow making use of a single-tone photoresist technique.
Figure 12B:
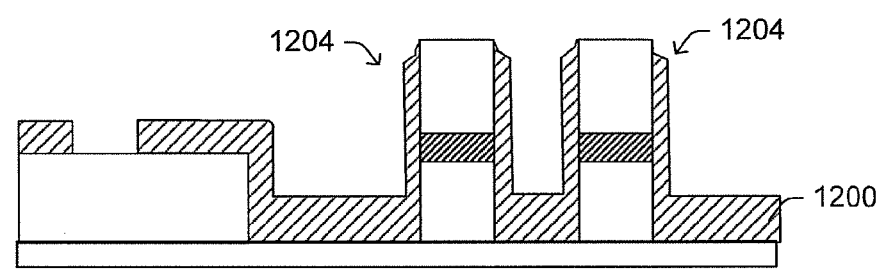
Figure 12C:
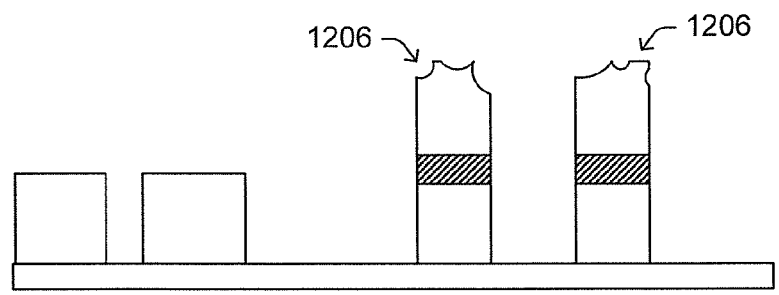

As will be appreciated further herein, aspects of the present disclosure relate to manufacturing techniques that use a dual-tone photoresist scheme to improve manufacturing techniques, particularly when workpieces with large variations in feature height and/or aspect ratio are used. As the inventors have appreciated, until now devices that include large variations in feature height and/or aspect ratio have been particularly challenging to manufacture. At least part of this manufacturing difficulty arises because conventional single-tone photoresist techniques often fail to adequately cover or protect the upper regions of relatively tall or relatively high-aspect ratio features. Therefore, when subsequent processing steps are carried out, the upper regions of these features can be degraded or damaged due to the lack of adequate photoresist protection. For example, FIGS. 12A-12C show a manufacturing process where a single-tone photoresist layer 1200 (e.g., a positive photoresist layer) is unacceptably weak or thin or non-existent 1202 over relatively tall or relatively high-aspect ratio features 1204. Hence, after the photoresist layer 1202 is patterned (FIG. 12B), a high temperature process or etch can be subsequently carried out and the photoresist layer is thereafter removed (FIG. 12C), causing the upper regions of the relatively tall or relatively high-aspect ratio features 1204 to be damaged or degraded 1206. This damage can lead to reliability issues for the resultant IC. Consequently, the present dual-tone photoresist techniques provided herein provide improved photoresist protection for the upper regions of tall/high aspect ratio features, thereby limiting or preventing damage to these upper regions to provide more reliable ICs than previously achievable.

As a person of ordinary skill appreciates, photoresist is a light-sensitive material used in several industrial processes, such as photolithography and photoengraving, to form a patterned coating on a workpiece surface. Photoresists are classified according to two types: positive photoresists and negative photoresists. A positive photoresist, which can also be said to have a positive photoresist tone, is a type of photoresist in which the portion of the photoresist that is exposed to light becomes soluble to photoresist developer and the portion of the photoresist that is unexposed to light remains insoluble to the photoresist developer. A negative resist, which can also be said to have a negative photoresist tone, is a type of photoresist in which the portion of the photoresist that is exposed to light becomes insoluble to the photoresist developer while the unexposed portion of the negative photoresist is dissolved by the photoresist developer. Thus, the photoresist tone, which can be either positive or negative, indicates how the photoresist reacts to a combination of light exposure and subsequent exposure to photoresist developer. As will be appreciated in greater detail below, the inventors have appreciated that using a combination of positive and negative photoresist provides some advantages in the manufacture of modern ICs.

Turning now to FIG. 1, one can see a flow diagram of a somewhat general manufacturing method 100 that uses a dual-tone photoresist scheme in accordance with some aspects of this disclosure.

The method 100 starts at 102 when a workpiece is provided. The workpiece can be a semiconductor substrate, a printed circuit board, a photonic material, a microelectrical-mechanical (MEMs) device, or a glass substrate, among others. A first photoresist layer having a first photoresist tone is provided over the workpiece (104), and is patterned to provide a first opening that exposes a first portion of the workpiece (106). A second photoresist layer, which has a second photoresist tone opposite the first photoresist tone, is provided over the patterned first photoresist layer (108). In 110, the second photoresist layer is patterned to provide a second opening that at least partially overlaps the first opening to define a coincidentally exposed workpiece region. At 112, a treatment, such as an etching treatment for example, is performed on the coincidentally exposed workpiece region. The use of two photoresist layers, which can be "stacked" over one another, provides improved protection against degradation, relative to single tone PR schemes.

Figure 2:
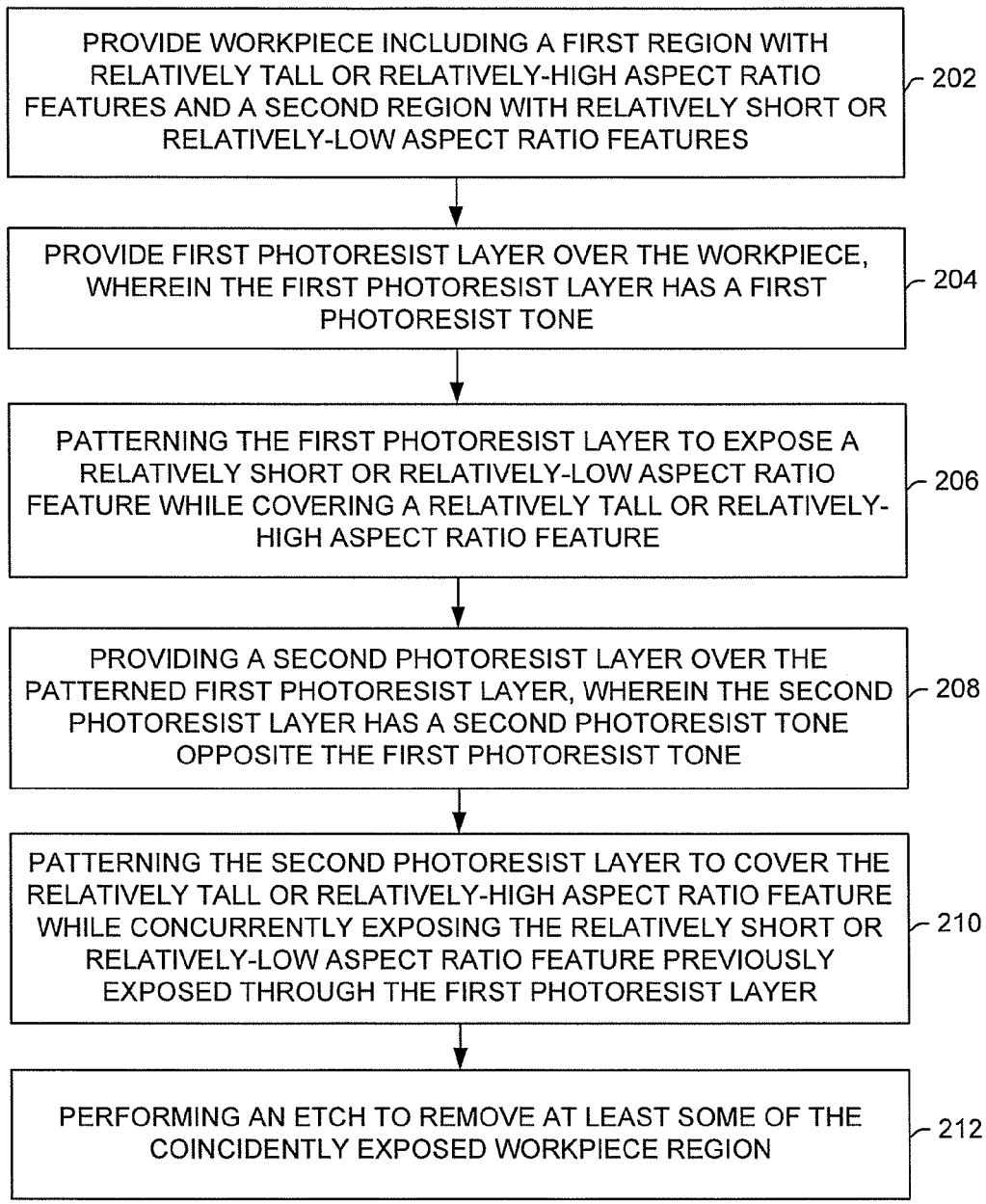
FIG. 2 is a flow diagram illustrating a method of fabricating a semiconductor device in accordance with some embodiments.

FIG. 2 shows a more particular flow diagram of a manufacturing method 200 in accordance with some aspects of this disclosure. In this embodiment, the workpiece to be processed is a semiconductor workpiece that includes a first region with relatively-high aspect ratio features and a second region with relatively-low aspect ratio features. A first photoresist layer having a first photoresist tone (e.g., negative photoresist tone) is provided over the semiconductor workpiece in 204. At 206, the first photoresist layer is patterned to exposes a relatively short or relatively-low aspect ratio feature while covering a relatively tall or relatively-high aspect ratio feature. The first photoresist layer serves as protection for these relatively-high aspect ratio features. At 208, a second photoresist layer, which has a second photoresist tone (e.g., positive photoresist tone), is provided over the patterned first photoresist layer. In 210, the second photoresist layer is patterned to cover the relatively tall or relatively high aspect ratio feature while concurrently exposing the relatively short or relatively low aspect ratio feature previously exposed through the first photoresist layer. The exposed region, which may be referred to as a coincidentally exposed workpiece region because the first and second photoresist layers both leave it exposed, corresponds to a relatively low height or relatively-low aspect ratio region. An etch is then performed to remove the coincidentally exposed workpiece region. This dual-tone photoresist technique allows the relatively low height or relatively low aspect ratio region to be patterned with little or no damage to the upper regions of the relatively tall or relative high aspect ratio regions.

To show a specific example consistent with FIG. 1 and/or FIG. 2's methodologies, FIGS. 3-11 show a series of cross sectional views at various stages of a manufacturing process that uses dual-tone photoresist techniques in accordance with some embodiments. Although these cross-sectional views show one example of how the manufacturing methods 100, 200 could be carried out, FIGS. 3-10 do not limit the scope the broader methods 100, 200 in any way. For example, although FIGS. 3-10 are described as using a first photoresist layer having a negative photoresist tone (e.g., first photoresist layer 400 in FIGS. 4-6) and a second photoresist layer having a positive photoresist tone (e.g., second photoresist layer 700 in FIG. 7-10), these tones can be reversed in other embodiments. Also, the term "relatively" as used in this specification (e.g., as in "relatively tall" and "relatively short" or "relatively high aspect ratio" and "relatively low aspect ratio") refers to the relationship between features on a single integrated circuit and is not necessarily relative to other industry standard features.

In addition, it will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. Thus, while methods illustrated and described herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases, and are not limited to the structures illustrated in FIGS. 3-11.

Figure 3:
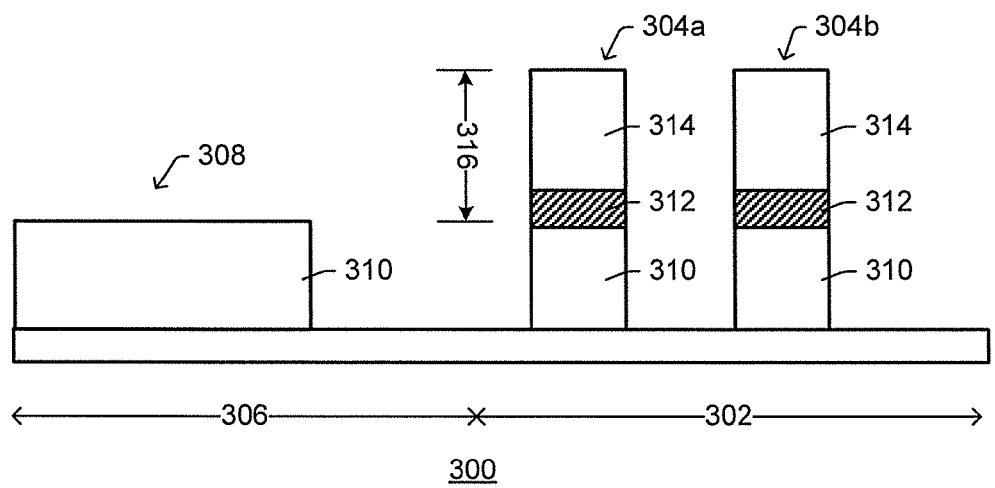
FIGS. 3-11 are cross-sectional views that collectively illustrate a semiconductor process flow making use of two different tones of photoresist to carry out a treatment step in accordance with some embodiments.

FIG. 3 shows a cross-sectional view of a semiconductor workpiece 300 at one stage of manufacture. It will be appreciated that "semiconductor workpiece" as referred to herein may comprise any type of semiconductor material including a bulk silicon wafer, a binary compound substrate (e.g., GaAs wafer), a ternary compound substrate (e.g., AlGaAs), or higher order compound wafers, with or without additional insulating or conducting layers formed thereover, among others. Further, the semiconductor workpiece 300 can also include non semiconductor materials such as oxide in silicon-on-insulator (SOI), partial SOI substrate, polysilicon, insulator, oxide, metal, amorphous silicon, or organic material, among others. In some embodiments, the semiconductor workpiece can also include multiple wafers or dies which are stacked or otherwise adhered together. The semiconductor workpiece can include wafers which are cut from a silicon ingot, and/or any other type of semiconductor/non-semiconductor and/or deposited or grown (e.g. epitaxial) layers formed on an underlying substrate.

In FIG. 3, the semiconductor workpiece 300 includes a first region 302 with relatively tall or relatively-high aspect ratio features 304a, 304b, and a second region 306 with relatively short or relatively-low aspect ratio features 308. In one embodiment, the relatively tall or relatively-high aspect ratio features 304a, 304b can include a first polysilicon layer 310, a hard mask layer 312, and a second polysilicon layer 314 stacked thereover. The relatively tall or relatively high aspect ratio features 304a, 304b can correspond to FinFET devices or flash memory devices in some embodiments. In contrast, the relatively short or relatively-low aspect ratio features 308 can include a first polysilicon layer 310, and can correspond to a low-voltage logic gate for example. In some embodiments, the upper surface heights of the first and second regions can be separated (316) by approximately 3000 angstroms, although the disclosed techniques can be applied to a wide range of different topographies not limited to 3000 angstroms.

Figure 4:
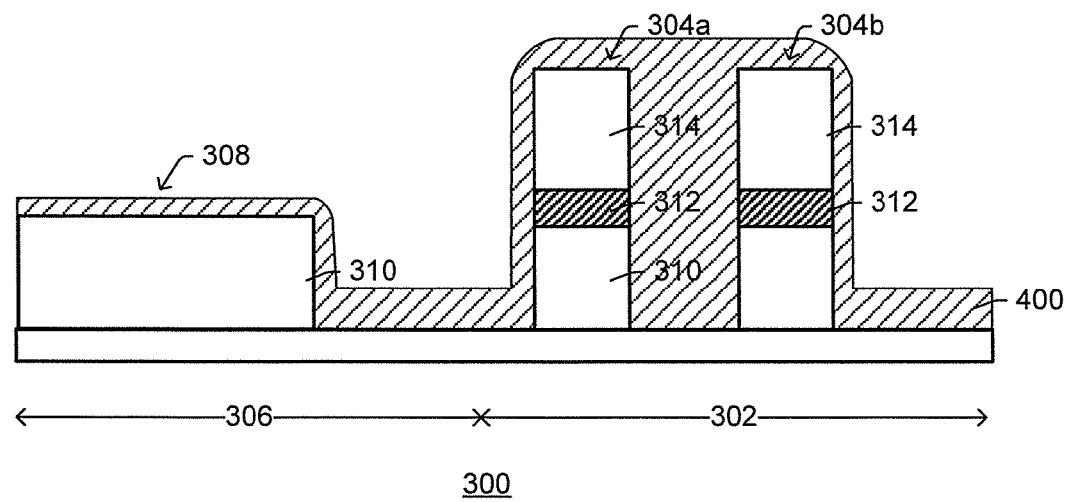

In FIG. 4, a first photoresist layer 400 is formed over the workpiece 300. In the illustrated embodiment, the first photoresist layer 400 is a negative photoresist layer exhibiting a negative photoresist tone. In some embodiments, the use of a negative photoresist for the first photoresist layer is advantageous because negative photoresist often exhibits better substrate adhesion and higher temperature resistance than positive photoresist.

Figure 5:
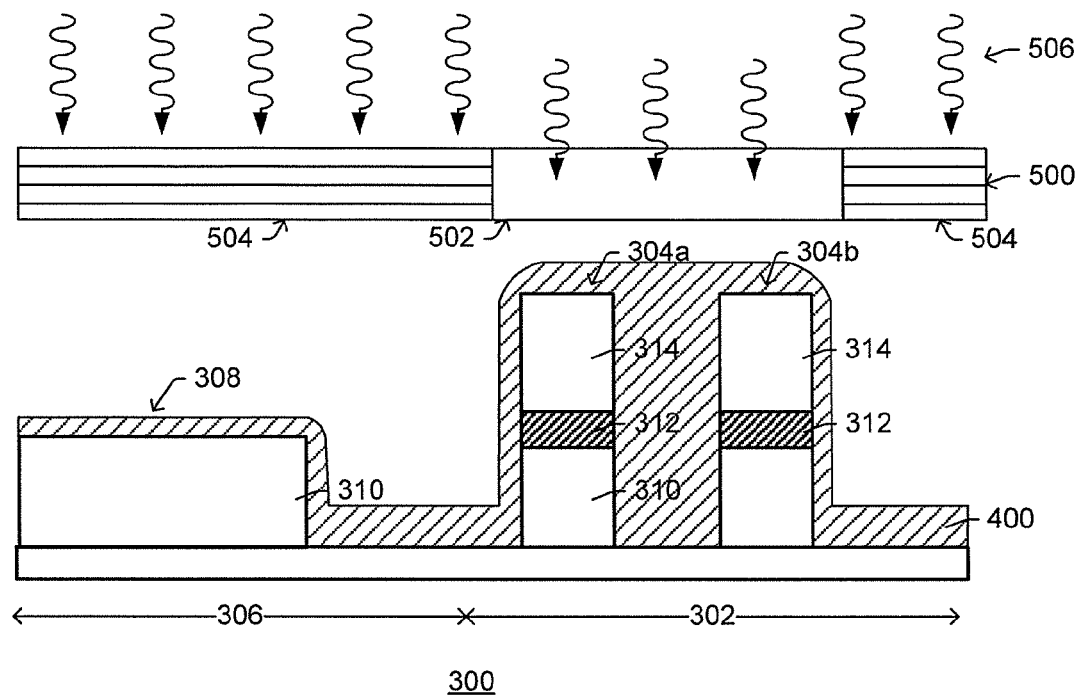

In FIG. 5, a first photomask 500, such as a reticle, is provided over the first photoresist layer 400. The first photomask 500 includes one or more window regions 502 through which photons can pass and one or more blocking regions 504 that block photons from passing therethrough. After the first photomask 500 is aligned with respect to the workpiece 300, a stream of photons 506 is applied to the workpiece 300 while the first photomask 500 is in place. The stream of photons, which only pass through the window region 502 to strike the relatively tall or relatively high-aspect ratio region 302 in this example, "harden" the exposed first photoresist layer 400, making the light exposed negative photoresist less soluable to photoresist developer than un-exposed regions.

Figure 6:
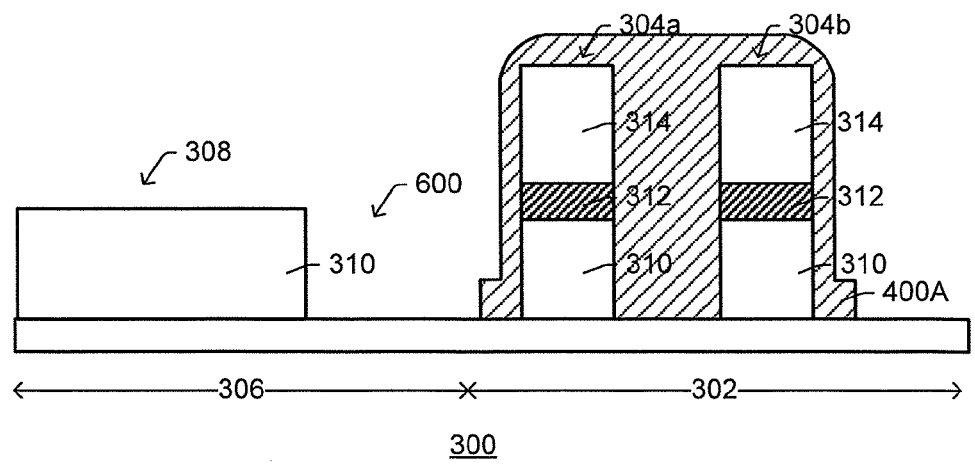

In FIG. 6, the workpiece 300 is subjected to (e.g., immersed in) a photoresist developing agent to form a patterned first photoresist layer 400A. As shown, after being developed, the patterned first photoresist layer 400A includes first opening 600 that exposes a portion of the workpiece. The remaining portion of the patterned first photoresist layer 400A, which was exposed to the stream of photons 506, covers the relatively tall or relatively high-aspect ratio features 304a, 304b for improved protection.

Figure 7:
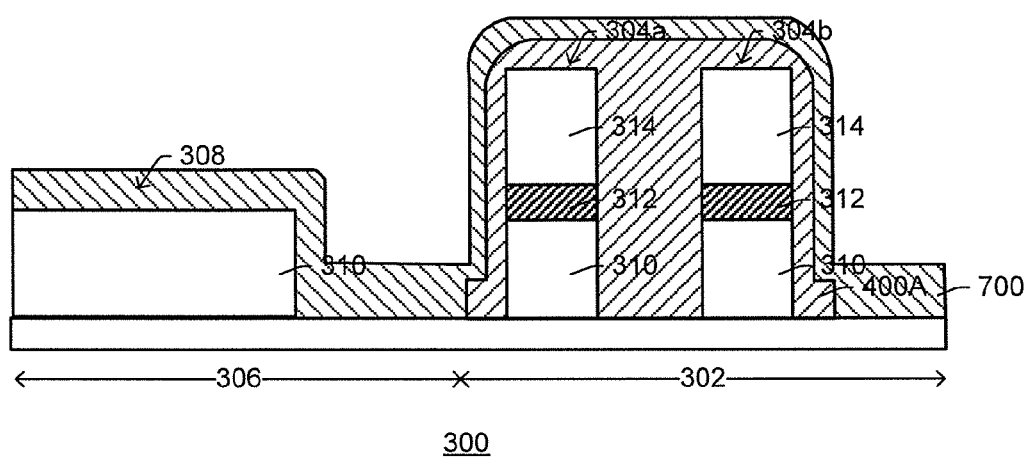

In FIG. 7, a second photoresist layer 700, which has a positive photoresist tone in this example, is provided over the patterned first photoresist layer 400A and the exposed portion of the workpiece.

Figure 8:
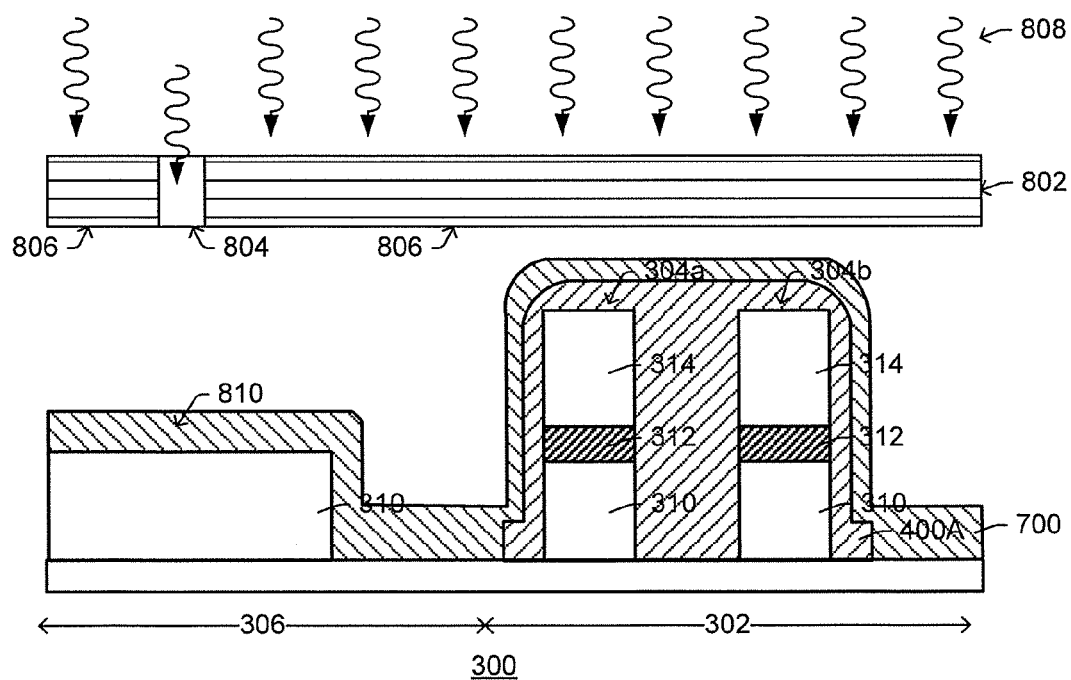

In FIG. 8, a second photomask 802, such as a reticle, is provided over the second photoresist layer 700. Like the first photomask, the second photomask 802 includes one or more window regions 804 through which photons can pass and one or more blocking regions 806 that block photons from passing therethrough. After the second photomask 802 is aligned with respect to the workpiece 300, a stream of photons 808 is applied to the workpiece while the second photomask is in place. The stream of photons, which only pass through the second photomask in the window region 804 in this example, "weaken" the exposed portion of the second photoresist layer 810, making the light exposed positive photoresist more soluble to photoresist developer than unexposed regions.

Figure 9:
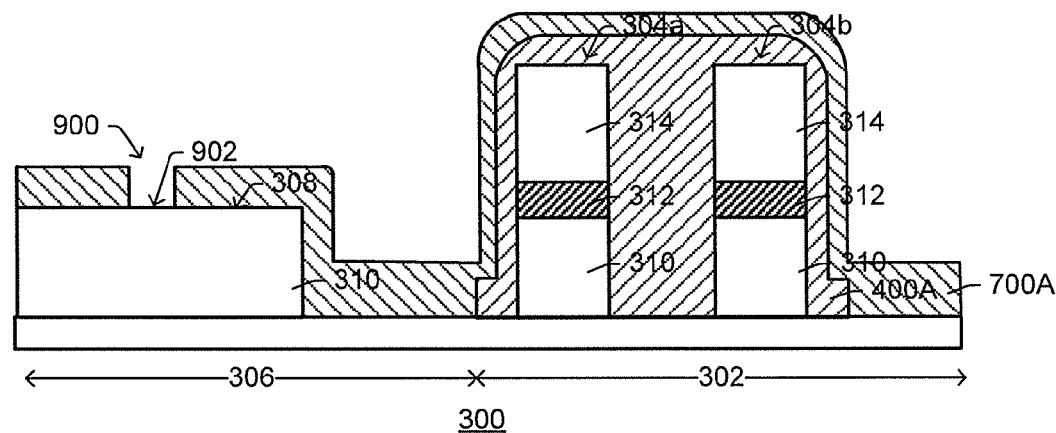

In FIG. 9, the workpiece 300 is subjected to (e.g., immersed in) a photoresist developing agent to form a patterned second photoresist layer 700A. As shown, after being developed, the patterned second photoresist layer 700A includes second opening 900 that at least partially overlaps the first opening to define a coincidentally exposed workpiece region 902. The remaining portion of the patterned second photoresist layer 700A, which was exposed to the stream of photons 808, covers the relatively tall or relatively high-aspect ratio features 304a, 304b and also partially covers the relatively short or relatively low aspect ratio features 308.

Figure 10:
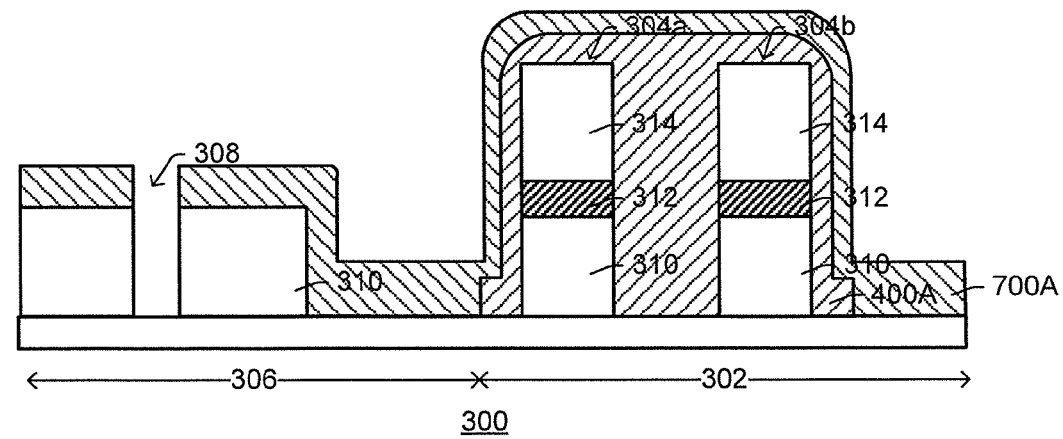

In FIG. 10, a treatment in the form of an etch is carried out. The etch removes the coincidentally exposed workpiece region 902 to thereby pattern the relatively short or relatively low aspect ratio features 308 as shown.

Figure 11:
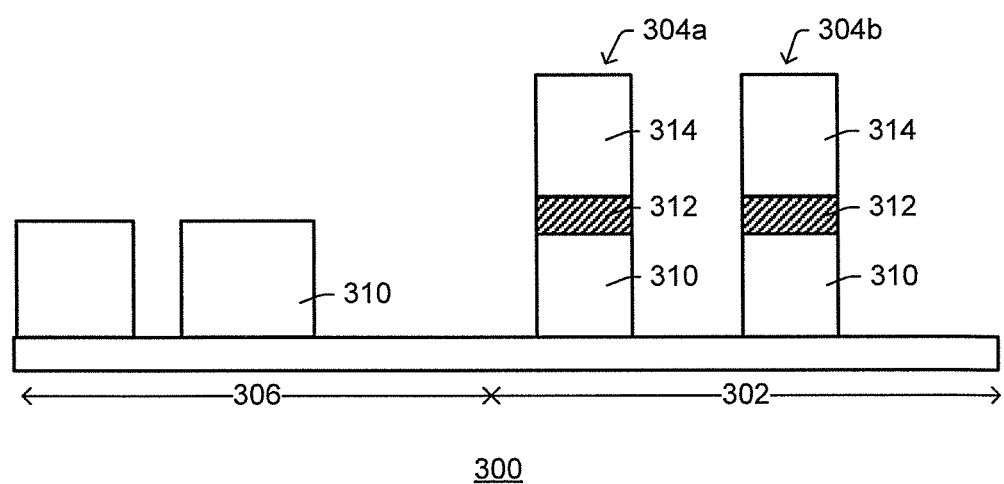

In FIG. 11, the first and second photoresist layers are removed, and the workpiece is cleaned so subsequent processing can take place. For example, a conductive layer or an insulating layer can be subsequently provided over the workpiece, and/or another layer of photoresist can be provided to provide further patterning of the workpiece. Notably, compared to conventional integrated circuits with varying topographies, the workpiece 300 shown in FIG. 11 includes upper regions of the relatively tall or relatively high-aspect ratio features that have little or no damage from the treatment (e.g., etch) carried out in FIG. 10. Thus, the upper regions can include substantially planar upper and sidewall surfaces which intersect one another at substantially 90° angles.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for processing a semiconductor workpiece, wherein the workpiece includes a first region with relatively tall or relatively-high aspect ratio features and a second region with relatively short or relatively-low aspect ratio features, the method comprising:
   providing a first photoresist layer over the semiconductor workpiece, wherein the first photoresist layer has a negative photoresist tone;
   patterning the first photoresist layer to cover a relatively tall or relatively-high aspect ratio feature while concurrently exposing a relatively short or relatively-low aspect ratio feature; wherein patterning the first photoresist layer comprises: providing a first photomask over the first photoresist layer, wherein the first photomask comprises: a first window region corresponding to the relatively tall or relatively high aspect ratio feature, and a first blocking region corresponding to the relatively short or relatively-low aspect ratio feature;
   providing a second photoresist layer over the patterned first photoresist layer, wherein the second photoresist layer has a positive photoresist tone;
   patterning the second photoresist layer to cover the relatively tall or relatively-high aspect ratio feature while concurrently exposing the relatively short or relatively-low aspect ratio feature previously exposed through the first photoresist layer; and
   while the patterned first and second photoresist layers are in place, performing an etch to remove the exposed relatively short or relatively-low aspect ratio feature.

2. The method of claim 1, further comprising:
   removing the first and second photoresist layers after the etch has been performed.

3. The method of claim 1, wherein patterning the first photoresist layer further comprises:
   exposing the workpiece with the first photomask in place thereover to a stream of photons having a wavelength structured to interact the first photoresist layer in the first window region; and
   developing the first photoresist layer to remove the first photoresist layer corresponding to the first blocking region, thereby forming a patterned first photoresist layer.

4. The method of claim 1, wherein patterning the second photoresist layer comprises:
   providing a second photomask over the second photoresist layer, wherein the second photomask comprises: a second window region corresponding to the relatively short or relatively low aspect ratio feature, a second blocking region corresponding to the relatively tall or relatively high aspect ratio feature.

5. The method of claim 4, wherein patterning the second photoresist layer further comprises:
   exposing the workpiece with the second photomask in place thereover to a stream of photons having a wavelength structured to interact the second photoresist layer in the second window region; and
   developing the second photoresist layer to remove the second photoresist layer corresponding to the second window region, thereby forming a patterned second photoresist layer.

6. A method for processing a semiconductor workpiece, comprising:
   providing a first photoresist layer over a workpiece, wherein the first photoresist layer has a first photoresist tone;

patterning the first photoresist layer to cover a relatively tall or relatively high-aspect ratio feature of the workpiece while exposing a relatively short or relatively low-aspect ratio feature of the workpiece;

providing a second photoresist layer over the patterned first photoresist layer, wherein the second photoresist layer has a second photoresist tone opposite the first photoresist tone;

patterning the second photoresist layer to provide an opening that leaves the relatively short or relatively low-aspect ratio feature of the workpiece exposed through the first and second photoresist layers; and performing a treatment on the relatively short or relatively low-aspect ratio feature exposed through the first and second photoresist layers;

wherein the relatively tall or relatively high-aspect ratio feature corresponds to a polysilicon layer associated with a flash memory device or a FinFET device.

7. The method of claim 6, wherein after the treatment, upper surfaces of the relatively tall or relatively high aspect ratio features are substantially continuous planar surfaces.

8. The method of claim 6, wherein after the treatment, the relatively tall or relatively high aspect ratio features have corners whose faces meet at angles of substantially 90°.

9. The method of claim 6, wherein the relatively short or relatively low-aspect ratio feature corresponds to a polysilicon layer associated with a low-voltage transistor device included in a digital logic block.

10. A method for processing a semiconductor workpiece, wherein the workpiece includes a first region with relatively tall or relatively-high aspect ratio features and a second region with relatively short or relatively-low aspect ratio features, the method comprising:

providing a first photoresist layer over the semiconductor workpiece, wherein the first photoresist layer has a first photoresist tone;

patterning the first photoresist layer to cover a relatively tall or relatively-high aspect ratio feature while concurrently exposing a relatively short or relatively-low aspect ratio feature;

providing a second photoresist layer over the patterned first photoresist layer, wherein the second photoresist layer has a second photoresist tone opposite the first photoresist tone;

patterning the second photoresist layer to cover the relatively tall or relatively-high aspect ratio feature while concurrently exposing the relatively short or relatively-low aspect ratio feature previously exposed through the first photoresist layer; and while the patterned first and second photoresist layers are in place, performing an etch to remove the exposed relatively short or relatively-low aspect ratio feature;

wherein the first photoresist tone corresponds to the first photoresist layer being negative photoresist and wherein the second photoresist tone corresponds to the second photoresist layer being positive photoresist;

wherein patterning the first photoresist layer comprises:

providing a first photomask over the first photoresist layer, wherein the first photomask comprises: a first window region corresponding to the relatively tall or relatively high aspect ratio feature, and a first blocking region corresponding to the relatively-low aspect ratio feature.

11. A method for processing a semiconductor workpiece, comprising:

providing a first photoresist layer over a workpiece, wherein the first photoresist layer has a first photoresist tone;

patterning the first photoresist layer to cover a relatively tall or relatively high-aspect ratio feature of the workpiece while exposing a relatively short or relatively low-aspect ratio feature of the workpiece;

providing a second photoresist layer over the patterned first photoresist layer, wherein the second photoresist layer has a second photoresist tone opposite the first photoresist tone;

patterning the second photoresist layer to provide an opening that leaves the relatively short or relatively low-aspect ratio feature of the workpiece exposed through the first and second photoresist layers; and performing a treatment on the relatively short or relatively low-aspect ratio feature exposed through the first and second photoresist layers;

wherein the relatively tall or relatively high-aspect ratio feature corresponds to a polysilicon layer associated with a flash memory device or a FinFET device.

* * * * *